(12) United States Patent
De Kruif et al.

(10) Patent No.: US 7,534,552 B2
(45) Date of Patent: May 19, 2009

(54) LITHOGRAPHIC APPARATUS AND DEVICE MANUFACTURING METHOD

(75) Inventors: Robertus Cornelis Martinus De Kruif, Eindhoven (NL); Richard Joseph Bruls, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 862 days.

(21) Appl. No.: 11/019,531

(22) Filed: Dec. 23, 2004

(65) Prior Publication Data

US 2006/0139606 A1  Jun. 29, 2006

(51) Int. Cl.
*G03F 7/00* (2006.01)
*G03B 27/52* (2006.01)

(52) U.S. Cl. .................. 430/296; 430/302; 430/311; 355/52; 355/53; 355/55; 355/67; 355/69

(58) Field of Classification Search .................. 430/311, 430/5, 296, 301; 355/53, 69, 52, 55, 67; 372/25, 29.014, 29.016, 57, 98
See application file for complete search history.

(56) References Cited

U.S. PATENT DOCUMENTS

| | | | |
|---|---|---|---|
| 5,303,002 A | 4/1994 | Yan | 355/53 |
| 5,684,565 A | 11/1997 | Oshida et al. | |
| 5,976,714 A * | 11/1999 | Arita et al. | 428/848.3 |
| 6,671,294 B2 * | 12/2003 | Kroyan et al. | 372/20 |
| 2002/0048288 A1 | 4/2002 | Kroyan et al. | 372/20 |
| 2005/0018164 A1 * | 1/2005 | Hansen | 355/69 |

OTHER PUBLICATIONS

U.S. Appl. No. 11/019,535, filed Dec. 23, 2004, Bruls et al.

* cited by examiner

*Primary Examiner*—Thorl Chea
(74) *Attorney, Agent, or Firm*—Pillsbury Winthrop Shaw Pittman LLP

(57) ABSTRACT

In known lithographic apparatus the projection beam is symmetrical, while the process window can be asymmetrical. The invention addresses this problem by providing a lithographic apparatus comprising an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate, wherein there is further provided a system for providing an asymmetric projection beam bandwidth distribution.

13 Claims, 11 Drawing Sheets

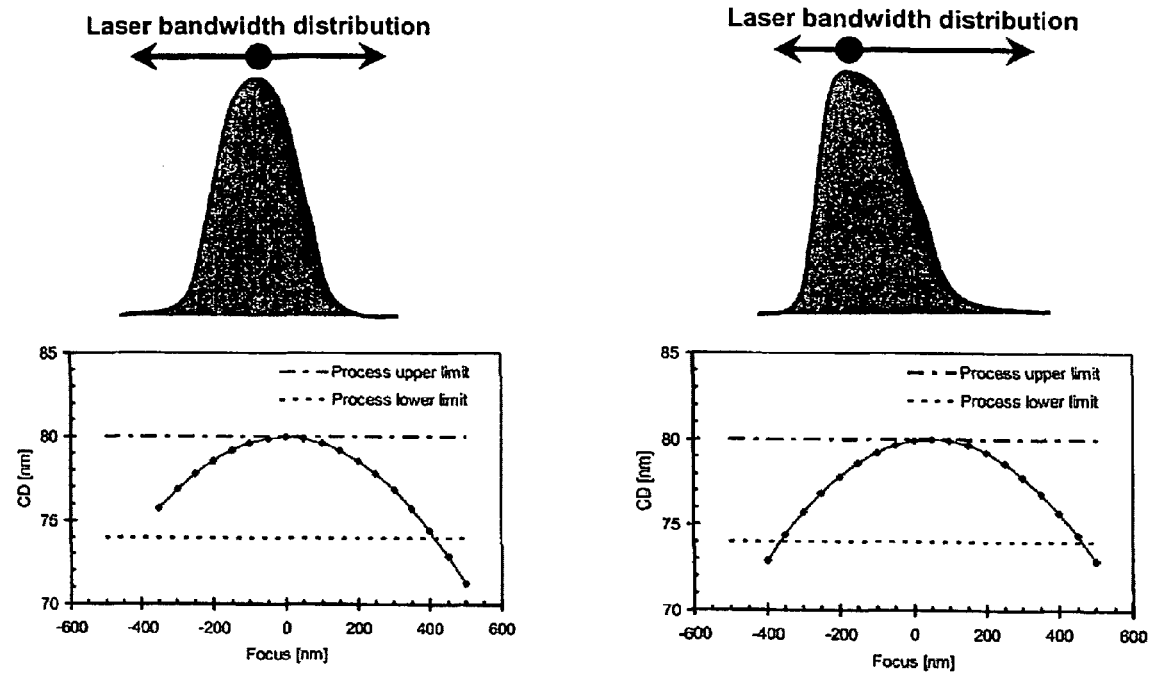
FIG 4(a)
FIG 4(b)
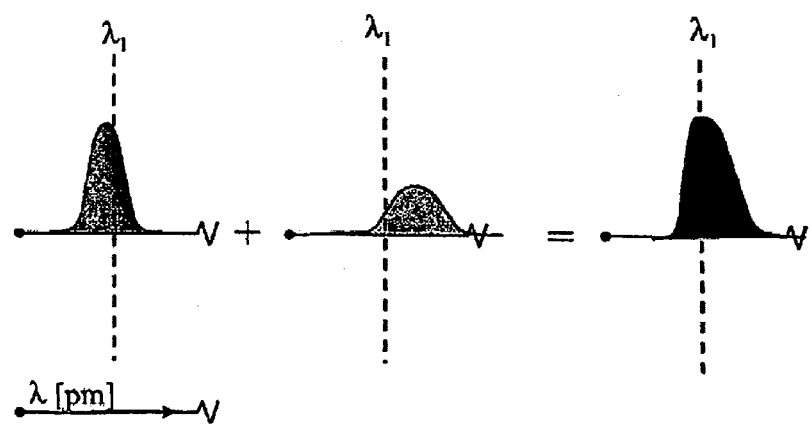
FIG 5

LITHOGRAPHIC APPARATUS AND DEVICE MANUFACTURING METHOD

BACKGROUND OF THE INVENTION

1. Field of the Invention

The present invention relates to a lithographic apparatus and a device manufacturing method. This invention also relates to a device manufactured thereby.

2. Background of the Related Art

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

Between the reticle and the substrate is disposed a projection system for imaging the irradiated portion of the reticle onto the target portion of the substrate. The projection system includes components for directing, shaping or controlling the projection beam of irradiation, and these components typically include refractive optics, reflective optics, and/or catadioptric systems, for example.

Generally, the projection system comprises structure to set the numerical aperture (commonly referred to as the "NA") of the projection system. For example, an adjustable NA-diaphragm is provided in a pupil of the projection system. The illumination system typically comprises adjustable optical elements for setting the outer and/or inner radial extent (commonly referred to as σ-outer and σ-inner, respectively) of the intensity distribution upstream of the mask (in a pupil of the illumination system). A specific setting of σ-outer and σ-inner may be referred to hereinafter as an annular illumination mode. Controlling the spatial intensity distribution at a pupil plane of the illumination system can be done to improve the processing parameters when an image of the illuminated object is projected onto a substrate.

Microchip fabrication involves the control of tolerances of a space or a width between devices and interconnecting lines, or between features, and/or between elements of a feature such as, for example, two edges of a feature. In particular the control of space tolerance of the smallest of such spaces permitted in the fabrication of the device or IC layer is of importance. Said smallest space and/or smallest width is referred to as the critical dimension ("CD").

With conventional projection lithographic techniques it is well known that an occurrence of a variance in CD for isolated features and dense features may limit the process latitude (i.e., the available depth of focus in combination with the allowed amount of residual error in the dose of exposure of irradiated target portions for a given tolerance on CD). This problem arises because features on the mask (also referred to as reticle) having the same nominal critical dimensions will print differently depending on their pitch on the mask (i.e., the separation between adjacent features) due to pitch dependent diffraction effects. For example, a feature consisting of a line having a particular line width when in isolation, i.e., having a large pitch, will print differently from the same feature having the same line width when together with other lines of the same line width in a dense arrangement on the mask, i.e., having small pitch. Hence, when both dense and isolated features of critical dimension are to be printed simultaneously, a pitch dependent variation of printed CD is observed. This phenomenon is called "iso-dense bias," and is a particular problem in photolithographic techniques. Iso-dense bias is typically measured in nanometers and represents an important metric for practical characterization of lithography processes.

Conventional lithographic apparatus do not directly address the problem of iso-dense bias. Conventionally, it is the responsibility of the users of conventional lithographic apparatus to attempt to compensate for the iso-dense bias by either changing the apparatus optical parameters, such as the NA of the projection lens or the σ-outer and σ-inner settings, or by designing the mask in such a way that differences in dimensions of printed isolated and dense features are minimized.

Generally, in a high volume manufacturing site different lithographic projection apparatus are to be used for the same lithographic manufacturing process step to ensure optimal exploitation of the machines, and consequently (in view of, for example, machine-to-machine differences) a variance and/or errors in CD may occur in the manufacturing process. Generally, the actual pitch dependency of such errors depends on the specific layout of the pattern and the features, the aberration of the projection system of the lithographic apparatus in use, the properties of the radiation sensitive layer on the substrate, and the radiation beam properties such as illumination settings, and the exposure dose of radiation energy. Therefore, given a pattern to be provided by a patterning device and to be printed using a specific lithographic projection apparatus including a specific radiation source, one can identify data relating to iso-dense bias which are characteristic for that process, when executed on that lithographic system. In a situation where different lithographic projection apparatus (of the same type and/or of different types) are to be used for the same lithographic manufacturing process step, there is a problem of mutually matching the corresponding different iso-dense bias characteristics, such as to reduce CD variations occurring in the manufacturing process.

A known technique to match an iso-dense bias characteristic of a machine (for a process whereby an annular illumination mode is used) to an iso-dense bias characteristic of another machine is to change the σ-outer and σ-inner settings, while maintaining the difference between the σ-outer and σ-inner settings (i.e., whilst maintaining the annular ring width of the illumination mode) of one of the two machines. The nominal σ-settings are chosen so as to optimize the process latitude (in particular, the depth of focus and the exposure latitude). Therefore, this approach has the disadvantage that for the machine whereby the σ-settings are changed, the process latitude is becoming smaller and may become too small for practical use.

U.S. Patent Publication No. 2002/0048288A1 (CYMER) relates to an integrated circuit lithographic technique for controlling bandwidths wherein the laser beam bandwidth is controlled to produce an effective beam spectrum having at least two spectral peaks in order to produce improved pattern resolution in photo-resist film. U.S. Patent Publication No. 2002/0048288A1 is incorporated herein by reference.

U.S. Pat. No. 5,303,002 (INTEL) relates to a method and apparatus for patterning a photo-resist layer wherein a plurality of bands of radiation are used to provide an enhanced depth of focus. U.S. Pat. No. 5,303,002 is incorporated herein by reference.

The present inventors have identified the following. The finite size of a laser bandwidth introduces a smear out of the image of a feature over a focus range around the best focus position in a resist layer (dF/dλ=C, where F=Focus, λ=wavelength, and C=a constant. In other words, when, for example, a drawing shows an axis in "Focus (μm)," this could be replaced by "wavelength (pm)." This has an effect on image contrast at the wafer level; a large laser bandwidth introduces a lower image contrast at wafer level, but at the same time the focus performance with respect to maximum Depth-of-Focus (DOF) is improved. In general the useable range of an Exposure Dose (ED)—window is asymmetric around best focus. For example, contact holes tend to have an asymmetric useable range in defocus so closing earlier in one defocus direction, as compared to the other.

An aspect of at least one embodiment of the at least one aspect of the present invention seeks to effectively remove the asymmetry of the ED-window, thereby enabling a more predictable behaviour of printing integrity. This is particularly useful for wafers having a considerable topography.

SUMMARY OF THE INVENTION

According to an aspect of the invention there is provided a lithographic apparatus including an illumination system for providing a projection beam of radiation, a support structure for supporting a patterning device, the patterning device serving to impart the projection beam with a pattern in its cross-section, a substrate table for holding a substrate; and a projection system for projecting the patterned beam onto a target portion of the substrate, wherein there is provided a system for providing an asymmetric projection beam distribution.

The projection beam distribution may be a projection beam or laser bandwidth distribution or wavelength distribution.

By this arrangement one can seek to ensure that a process window is symmetrical with respect to focus. This provides pattern fidelity, and may control a focal position of an aerial image with respect to the substrate. The invention provides improved imaging performance Critical Dimension Uniformity (CDU) control for substrates (wafers) having topology.

In one implementation the system for providing an asymmetric projection beam distribution may also allow control and/or adjustment of such distribution.

The system for providing an asymmetric projection beam distribution may cause a superimposition of at least two wavelength spectra with a wavelength difference and a bandwidth difference. Such superimposition may provide the asymmetric projection beam distribution.

The wavelength difference may be between 0 to 4 pm, 0 to 1 pm or 0 and 0.5 pm, and preferably smaller than 1 pm or 0.5 pm. The bandwidth (E95) may be between 0 and 1.0 pm and preferably around 0.5 pm.

In another implementation the system for providing an asymmetric projection beam distribution may cause a superimposition of at least two wavelength spectra with a wavelength difference and (optionally) with substantially a same bandwidth but different intensities. Such superimposition may provide the asymmetric projection beam distribution.

The wavelength difference may be between 0 and 1.0 pm or 0 to 0.5 pm, and preferably smaller than 1 pm or 0.5 pm. The wavelength rated intensity difference may be greater than 10%.

The intensity x wavelength shift ratio between the left and right side of the wavelength distribution with respect to the centre of the total wavelength range (as determined based on E95) may be $1.1 \leq |I_{left}|/|I_{right}|$ or $0.9 \geq |I_{left}|/|I_{right}|$ so as to provide a distribution which is asymmetric.

In a third implementation the features of the first and second implementations may be combined. The system for providing an asymmetric projection beam distribution may include structure for splitting a projection beam into at least two components having different wavelengths, a wavelength shifter, for altering the bandwidth and/or an attenuator for altering intensity of at least one of the components, and a recombinator for recombining the components.

There may be provided a plurality of radiation sources. For example, there may be provided two radiation sources thereby forming a dual radiation source. The different radiation sources may have discrete peaks, the discrete peaks of the different radiation sources being separated from one another.

The asymmetric projection beam bandwidth distribution may comprise at length two wavelength spectra which may be exposed upon the substrate, preferably, substantially simultaneously or, alternatively, sequentially. The separation of the discrete peaks of the different radiation sources ranges from between 0 and 1 pm and preferably between 0 and 0.5 pm.

The projection beam radiation used may have a wavelength in the Deep Ultra-Violet (DV). More particularly, the projection beam radiation used may have a wavelength of about 50 to 500 nm, or about 100 to 400 nm. The projection beam radiation may have a wavelength of about 126 nm, 157 nm, 193 nm, 248 nm or 365 nm. The projection beam radiation may have a wavelength in the extreme ultra-violet (EUV), e.g., having a wavelength in the range of about 5 to 20 nm or 20 to 50 nm. The projection beam radiation may have a wavelength of about 13.5 nm.

A projection beam or radiation source(s) may be a laser. For example, the radiation source may be an excimer laser.

According to a further aspect of the present invention there is provided a lithographic apparatus comprising a system for providing an asymmetric projection beam distribution.

According to a further aspect of the invention there is provided a device manufacturing method including providing a substrate, providing a projection beam of radiation using an illumination system, using a patterning device to impart the projection beam with a pattern in its cross-section, and projecting the patterned beam of radiation onto a target portion of the substrate, wherein the projection beam is asymmetric. The projection beam may be made asymmetric within the illumination system.

According to a yet further aspect of the invention there is provided a device manufactured according to the above-referenced device manufacturing method and/or by the above-referenced lithographic apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5-20 nm), as well as particle beams, such as ion beams or electron beams.

The term "patterning device" used herein should be broadly interpreted as referring to devices that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. The support structure supports, i.e., bears the weight of, the patterning device. It holds the patterning device in a way depending on the orientation of the patterning device, the design of the lithographic apparatus, and other conditions, such as for example whether or not the patterning device is held in a vacuum environment. The support can be using mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device."

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the projection beam of radiation, and such components may also be referred to below, collectively or singularly, as a "lens."

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g., water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 4(a) is an example of an asymmetric Bossung with indication of a useable range;

FIG. 4(b) is an example of a symmetric Bossung after applying a symmetric laser bandwidth and asymmetric Bossung of FIG. 4(a);

FIG. 5 is an example of generation of an asymmetric laser bandwidth;

DETAILED DESCRIPTION OF THE DRAWINGS

Figure 1:
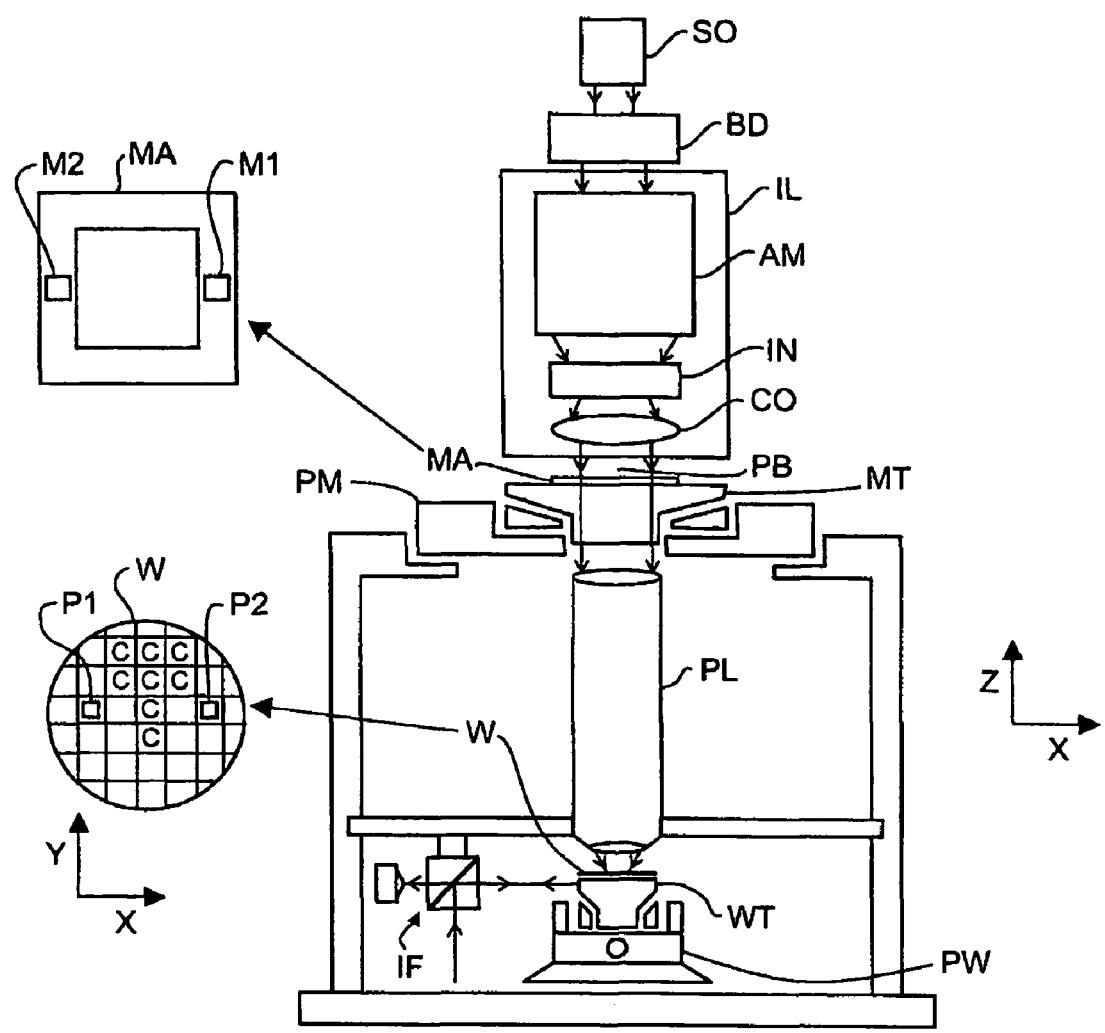
FIG. 1 depicts a lithographic apparatus according to an embodiment of the invention.

FIG. 1 schematically depicts a lithographic apparatus according to a particular embodiment of the invention. The apparatus comprises:

an illumination system (illuminator) IL for providing a projection beam PB of radiation (e.g., UV radiation or EUV radiation).

a first support structure (e.g., a mask table) MT for supporting a patterning device (e.g., a mask) MA and connected to first positioning actuator PM for accurately positioning the patterning device with respect to item PL;

a substrate table (e.g., a wafer table) WT for holding a substrate (e.g., a resist-coated wafer) W and connected to second positioning actuator PW for accurately positioning the substrate with respect to item PL; and a projection system (e.g., a refractive projection lens) PL for imaging a pattern imparted to the projection beam PB by patterning device MA onto a target portion C (e.g., comprising one or more dies) of the substrate W.

As here depicted, the apparatus is of a transmissive type (e.g., employing a transmissive mask). Alternatively, the apparatus may be of a reflective type (e.g., employing a programmable mirror array of a type as referred to above).

The illuminator IL receives a beam of radiation from a radiation source SO. The source SO and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be an integral part of the apparatus, for example when the source is a mercury lamp. The source SO and the illuminator IL, together with the beam delivery system BD if required, may be referred to as a radiation system.

The illuminator IL may comprise adjustable optical elements AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator IL provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioning device PW and position sensor IF (e.g., an interferometric device), the substrate table WT can be moved accurately, e.g., so as to position different target portions C in the path of the beam PB. Similarly, the first positioning actuator PM and another position sensor (which is not explicitly depicted in FIG. 1) can be used to accurately position the mask MA with respect to the path of the beam PB, e.g., after mechanical retrieval from a mask library, or during a scan. In general, movement of the object tables MT and WT will be realized with the aid of a long-stroke module (coarse positioning) and a short-stroke module (fine positioning), which form part of the positioning actuator PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e., a single dynamic exposure). The velocity and direction of the substrate table WT relative to the mask table MT is determined by the (de-) magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
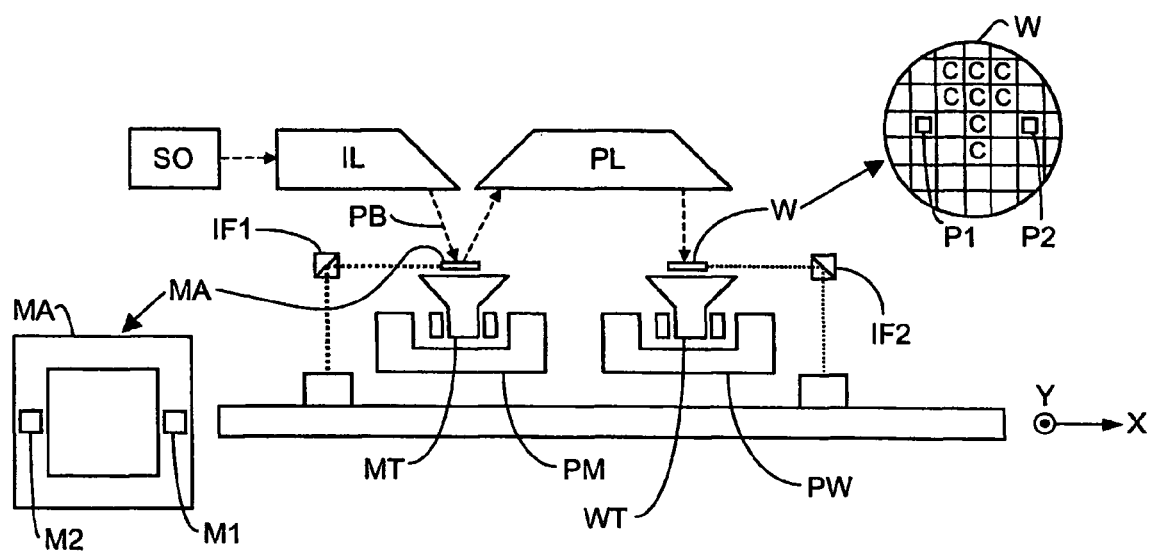
FIG. 2 depicts a lithographic apparatus according to another embodiment of the invention.

FIG. 2 schematically depicts a lithographic apparatus according to one embodiment of the invention. The apparatus of FIG. 2, in contrast to the apparatus in FIG. 1, is of a reflective type (e.g., employing a reflective mask).

The apparatus of FIG. 2 comprises:

an illumination system (illuminator) IL configured to condition a radiation beam B (e.g., UV radiation or EUV radiation);

a support structure (e.g., a mask table) MT constructed to support a patterning device (e.g., a mask) MA and connected to a first positioner PM configured to accurately position the patterning device in accordance with certain parameters;

a projection system (e.g., a refractive projection lens system) PS configured to project a pattern imparted to the radiation beam B by patterning device MA onto a target portion C (e.g., comprising one or more dies) of the substrate W.

In many cases the Exposure Dose (ED)-window and its Bossung are not totally asymmetric around best focus (e.g., contact holes generally close earlier in one defocus position than the other). In the present invention an asymmetric projection beam or laser bandwidth is used to correct for the asymmetric Bossung, and make the Useable Focus Range (viable process/production window) asymmetric around best focus. Thus the focus behaviour of features is made asymmetric using an asymmetric projection beam or laser bandwidth.

Figure 3A:
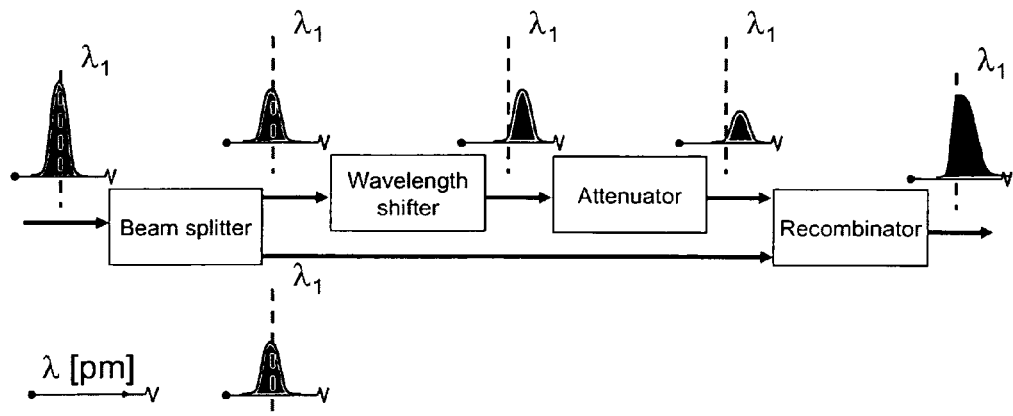
FIG. 3(a) is a schematic diagram of a system for providing an asymmetric beam bandwidth distribution.

Referring to FIG. 3(a), there is provided a system for providing an asymmetric projection beam bandwidth distribution including a beamsplitter for splitting a projection beam into at least two components having different wavelengths comprising a beam splitter, a shifter for altering the wavelength, the bandwidth and/or the intensity of at least one of the components comprising a wavelength shifter and an attenuator; and a recombinator for recombining the components, which in a particular embodiment are provided in the illumination system. The recombined components of the now asymmetric projection beam bandwidth distribution are used to expose the patterning device and substrate. Such may be provided in the illumination system. Such may be provided in the illumination system.

In a modification a laser beam bandwidth can be controlled to produce an effective beam spectrum having at least two spectral peaks as disclosed in U.S. Publication No. 2002/0048288. One or both of the said peaks can be attenuated in bandwidth and/or intensity, and then combined in a suitable manner so as to provide the asymmetric beam bandwidth distribution.

Figure 3B:
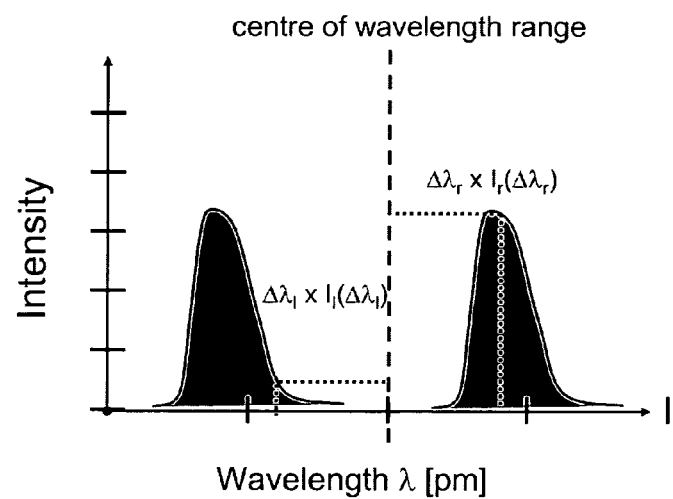
FIG. 3(b) is an example of how to determine whether a projection beam or laser bandwidth distribution is symmetrical.

Referring now to FIG. 3(b), there is shown an example of how to determine whether a laser bandwidth distribution is asymmetrical. Note $$I_{left} = \int \Delta \lambda_l \times I_l(\Delta \lambda_l) d\Delta \lambda_l \text{ and } I_{right} = \int \Delta \lambda_r \times I_r(\Delta \lambda_r) d\Delta \lambda_r.$$

Figure 3C:
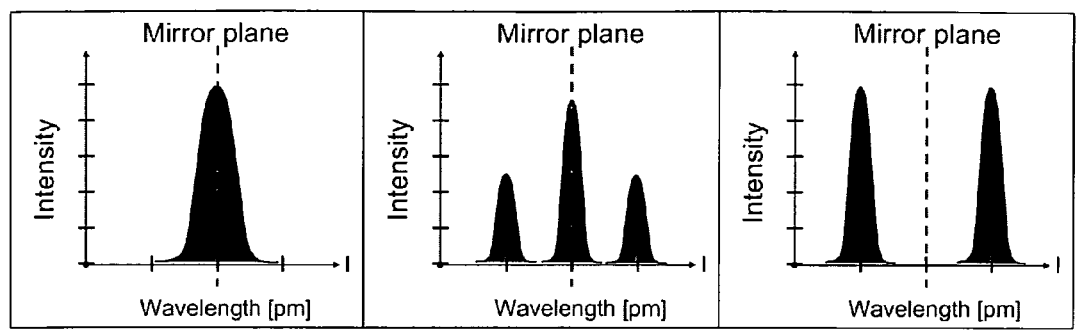
FIG. 3(c) is an example of symmetric projection beam or Iso bandwidth distribution.
Figure 3D:
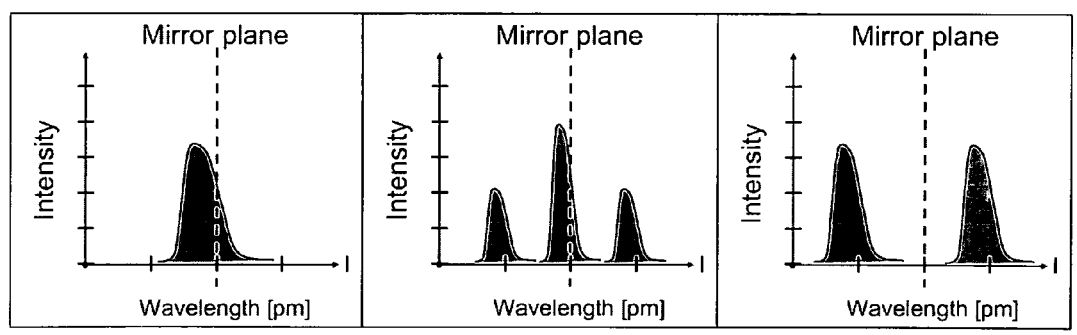
FIG. 3(d) is an example of asymmetric projection beam or laser bandwidth distributions.

FIG. 3(c) shows examples of symmetric laser bandwidth distributions, while FIG. 3(d) shows examples of asymmetric laser bandwidth distributions.

Referring now to FIG. 4(a), there is shown an example of an asymmetric Bossung with indication of the useable range. Note that in negative defocus, the process window is not limited in negative defocus by the indicated lower process limit by e.g., pattern collapse. Whereas in positive defocus the CD is limited by the laser process limit.

Referring to FIG. 4(b), there is shown an example of an asymmetric Bossung (after applying an asymmetric laser bandwidth on a symmetric Bossung presented in FIG. 4), with indication of the useable window. Note that in negative defocus, the process window is now limited by the lower process limit.

Referring to FIG. 5, there is shown an example of a generation of an asymmetric laser bandwidth based on two wavelengths that differ in intensity and bandwidth.

We will now look at RX (Wafer Tilt) Induced CD Change and show the analogy between introduction of wafer RX tilt resulting in a focus distribution of the aerial image during scan and applying a symmetric and/or asymmetric laser bandwidth which also results in a focus distribution of the aerial image.

Figure 6:
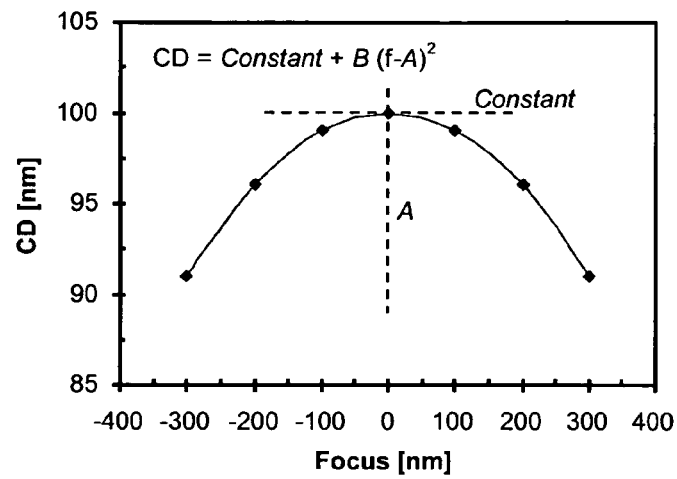
FIG. 6 is a schematic representation of a part of a Bossung curve.

Referring to FIG. 6 there is shown a schematic representation of a part of a Bossung curve (CD through focus at constant energy) assuming a quadratic behaviour in focus for the CD change. Note that the constant A is parameter describing the Best Focus (BF) position.

Figure 7:
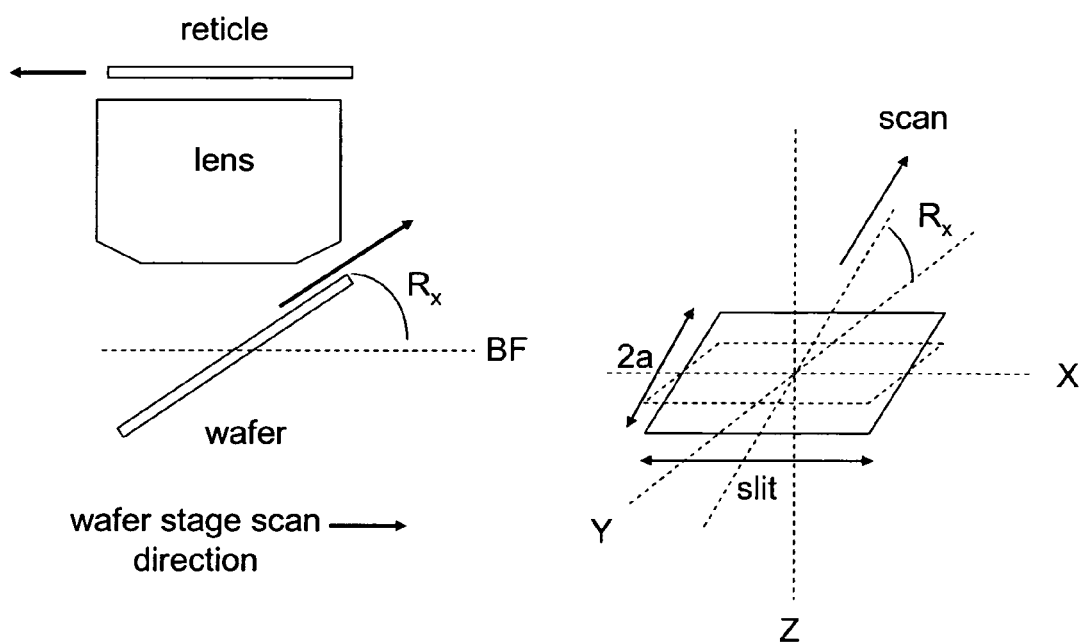
FIG. 7 is a schematic representation of introduction of a wafer $R_x$ tilt.

Referring now to FIG. 7, there is shown a schematic representation of introduction of a wafer Rx tilt. In scan direction each point of the wafer sees a through focus behavior ranging from $-a \cdot R_x$ to $a \cdot R_x$. The average CD (at best focus) of a feature due to the introduction of an Rx tilt (using the information as presented in FIG. 6 and FIG. 7) is given by:

$$\overline{CD} = \frac{\int_{-a \cdot R_x}^{a \cdot R_x} C + B \cdot f^2 \, df}{\int_{-a \cdot R_x}^{a \cdot R_x} df}$$

-continued $$= \frac{C \cdot f + B \cdot \frac{1}{3} f^3 \Big|_{-a \cdot R_x}^{a \cdot R_x}}{f \Big|_{-a \cdot R_x}^{a \cdot R_x}}$$

$$= \frac{C \cdot 2a \cdot R_x + B \cdot \frac{2}{3} a^3 \cdot R_x^3}{2a \cdot R_x}$$

$$= C + B \cdot \frac{1}{3} a^2 \cdot R_x^2$$

From the above equation it is clear that the $\Delta$CD due to the introduction of a wafer $R_x$ tilt is given by:

$$\Delta CD = B \cdot \frac{1}{3} a^2 \cdot R_x^2 \sim R_x^2$$

Assuming that the energy dependence of the CD is focus independent (so $\partial CD/\partial E \neq F(f)$) the impact of $R_x$ on CD can be easily compensated in order to maintain the CD of the reference feature unaltered.

The equation for the CD change due to $R_x$ tilt can be generalized for an arbitrary focus position F as follows:

$$\overline{CD} = \frac{\int_{F-a \cdot R_x}^{F+a \cdot R_x} C + B \cdot f^2 \, df}{\int_{F-a \cdot R_x}^{F+a \cdot R_x} df}$$

$$= \frac{C \cdot f + B \cdot \frac{1}{3} f^3 \Big|_{F-a \cdot R_x}^{F+a \cdot R_x}}{f \Big|_{F-a \cdot R_x}^{F+a \cdot R_x}}$$

$$= \frac{C \cdot 2a \cdot R_x + B \cdot \frac{1}{3}(6F^2 \cdot a \cdot R_x + 2a^3 \cdot R_x^3)}{2a \cdot R_x}$$

$$= C + B \cdot \frac{1}{3}(3F^2 + a^2 \cdot R_x^2)$$

Rewriting this equation and generalizing it for all for Focus $f$ results in:

$$CD = C + B \cdot F^2 + B \cdot \frac{1}{3} a^2 \cdot R_x^2$$

So the shift in CD induced by $R_x$ is independent of the focus position and is proportional with $R_x^2$.

For a fourth order focus term can be derived:

$$\overline{CD} = \frac{\int_{F-a \cdot R_x}^{F+a \cdot R_x} E \cdot f^4 \, df}{\int_{F-a \cdot R_x}^{F+a \cdot R_x} df}$$

$$= \frac{E \cdot \frac{1}{5} f^5 \Big|_{F-a \cdot R_x}^{F+a \cdot R_x}}{f \Big|_{F-a \cdot R_x}^{F+a \cdot R_x}}$$

$$= \frac{E \cdot \frac{1}{5}(10a \cdot R_x \cdot F^4 + 20a^3 \cdot R_x^3 \cdot F^2 + 2a^5 \cdot R_x^5)}{2a \cdot R_x}$$

-continued $$= E \cdot \left(F^4 + 2a^2 \cdot R_x^2 \cdot F^2 + \frac{1}{5}a^4 \cdot R_x^4\right)$$

For a first order focus term can be derived:

$$\overline{CD} = \frac{\int_{F-a \cdot R_x}^{F+a \cdot R_x} D \cdot f^1 \, df}{\int_{F-a \cdot R_x}^{F+a \cdot R_x} df}$$

$$= \frac{D \cdot \frac{1}{2} f^2 \Big|_{F-a \cdot R_x}^{F+a \cdot R_x}}{f \Big|_{F-a \cdot R_x}^{F+a \cdot R_x}}$$

$$= \frac{D \cdot \frac{1}{2}(4a \cdot R_x \cdot F)}{2a \cdot R_x}$$

$$= D \cdot (F)$$

So Rx does not impact the linear focus term.

The equation for the CD change due to $R_x$ tilt can be generalized for an arbitrary focus position F as follows:

$$\overline{CD} = \frac{\int_{F-a \cdot R_x}^{F+a \cdot R_x} C + B \cdot f^2 \, df}{\int_{F-a \cdot R_x}^{F+a \cdot R_x} df}$$

$$= \frac{C \cdot f + B \cdot \frac{1}{3} f^3 \Big|_{F-a \cdot R_x}^{F+a \cdot R_x}}{f \Big|_{F-a \cdot R_x}^{F+a \cdot R_x}}$$

$$= \frac{C \cdot 2a \cdot R_x + B \cdot \frac{1}{3}(6F^2 \cdot a \cdot R_x + 2a^3 \cdot R_x^3)}{2a \cdot R_x}$$

$$= C + B \cdot \frac{1}{3}(3F^2 + a^2 \cdot R_x^2)$$

Rewriting this equation and generalizing it for all for Focus f results in:

$$CD = C + B \cdot F^2 + B \cdot \frac{1}{3}a^2 \cdot R_x^2$$

Figure 8:
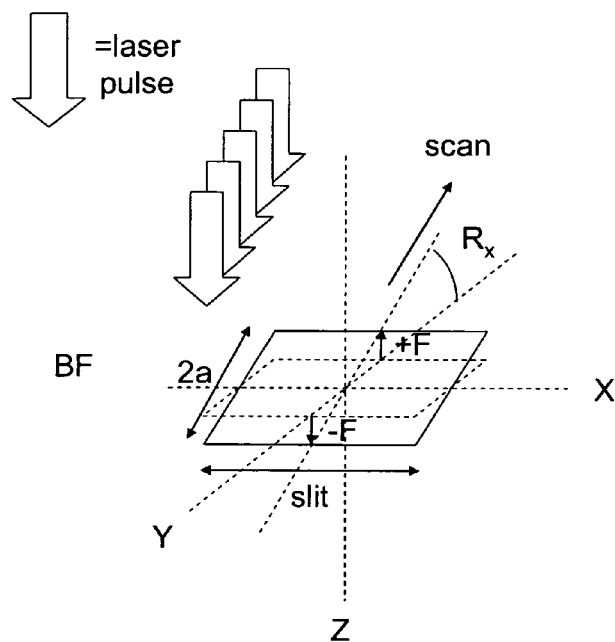
FIG. 8 is a schematic representation of introduction of a wafer $R_x$ tilt.

We will now discuss the relation between wafer tilt (RX) and projection beam or laser bandwidth. Referring to FIG. 8, there is shown a schematic representation of introduction of a wafer Rx tilt showing that when exposing the wafer with Rx tilt, the wafer is exposed at different focus positions (−F to +F) during the scan. In scan direction each point of the wafer sees a through focus behavior ranging from −a·$R_x$ to a·$R_x$. (2a is slit width).

The imaging situation as is presented in FIG. 8 can be also achieved by using a finite laser bandwidth. In general wavelength has an impact on best focus position (see FIG. 1a of U.S. Publication No. 2002/0048288 A1), so by stretching the laser bandwidth has a similar result on the aerial image of a structure as wafer tilt.

Figure 9:
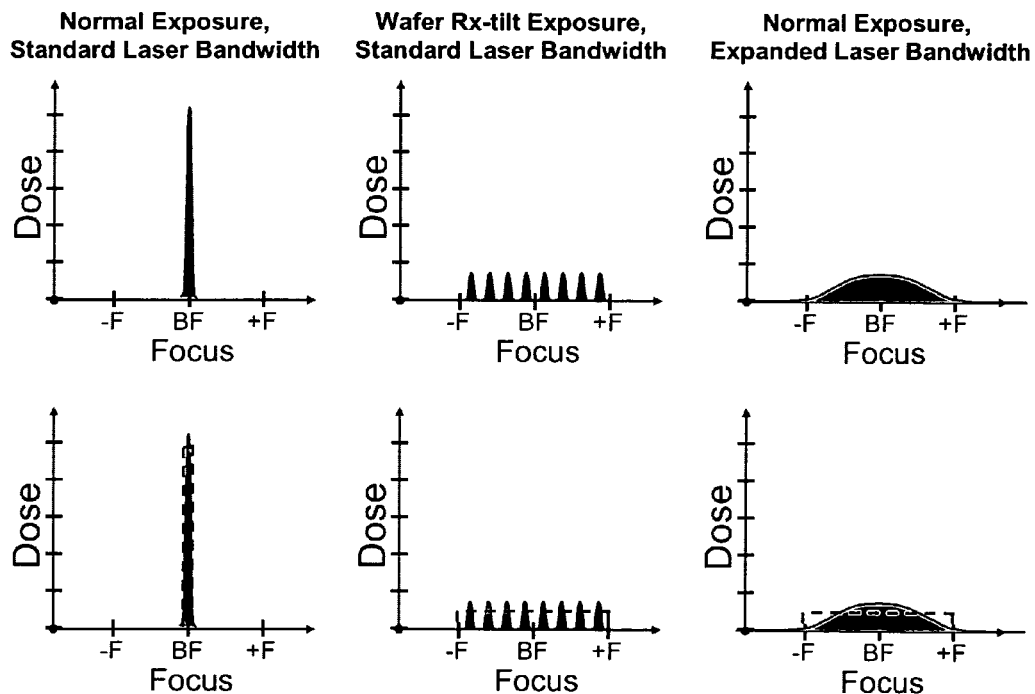
FIG. 9 is a schematic representation illustrating an analogy of effect of wafer Rx tilt on focus history seen by a part of the wafer during scan and a normal exposure (no Rx tilt) but now with a no zero bandwidth laser pulse.

Referring to FIG. 9, there is shown a schematic representation of effect of wafer-$R_x$ tilt and laser bandwidth stretching on focus and dose seen by the structure to be imaged as compared to normal exposure.

Figure 10:
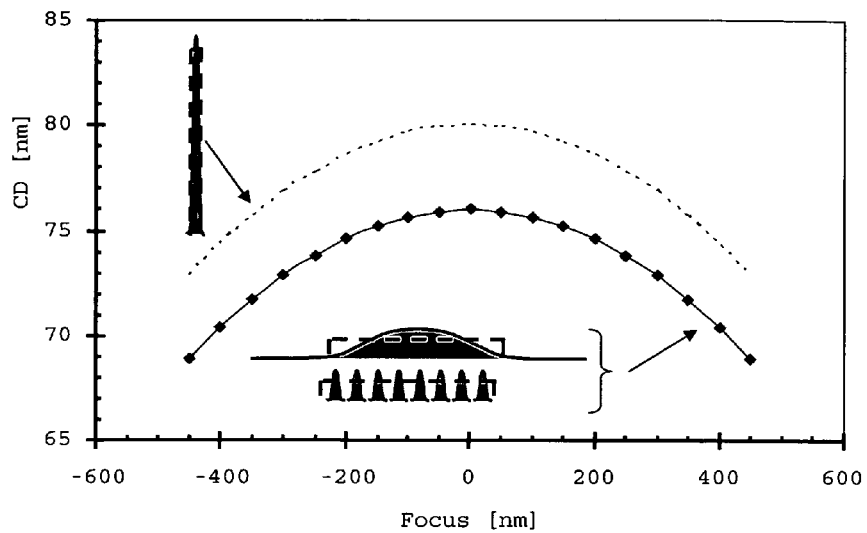
FIG. 10 is an example of a part of a Bossung curve showing schematically the effect of wafer Rx tilt or laser bandwidth.

Referring to FIG. 10, there is shown an example of a part of a Bossung curve (CD versus focus as function of energy (iso-energy line is depicted)) showing the impact of Rx-tilt and/or laser bandwidth increase as compared to normal exposure.

For a symmetric laser bandwidth distribution the effect on a part of a Bossung curve is schematically depicted in FIG. 10. The formulas as given above can be used to calculate the impact of a focus variation from −F to +F during exposure of a structure.

Turning now the asymmetrical situation. Assume that it is possible to create an aerial image with an asymmetric focus history, e.g., from −a·$r_x$ to 2a·$r_x$ (or −f to +2f with both focus step having the same dose). See FIG. 11.

Figure 11:
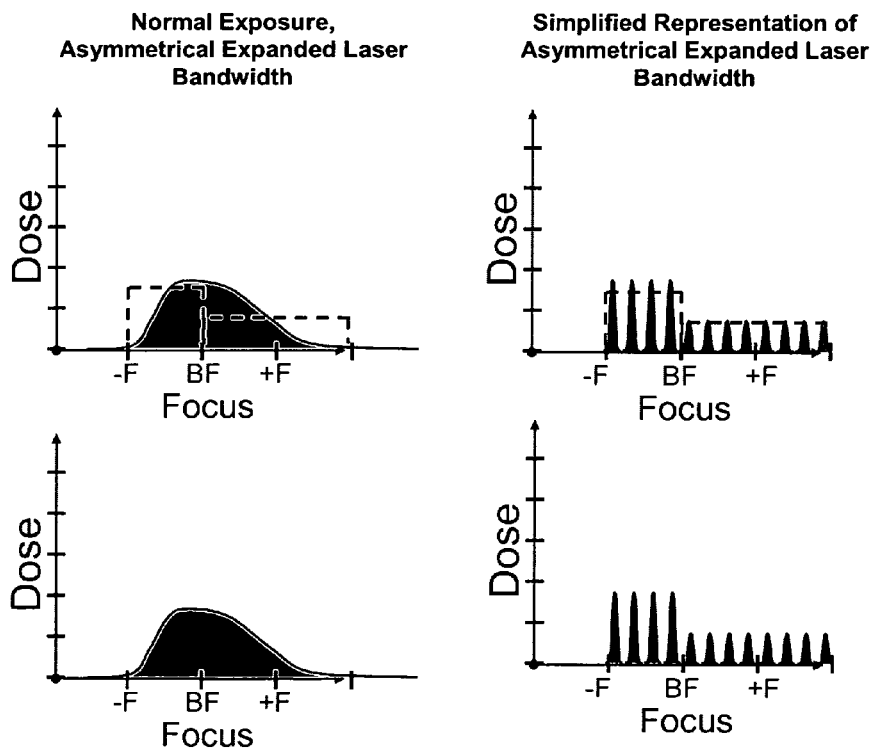
FIG. 11 is a schematic representation of a symmetric laser bandwidth in right focus range.

FIG. 11 shows a schematic representation of asymmetric laser bandwidth right focus range is twice the left focus range having both the same dose.

Considering FIG. 10 and FIG. 11 the effect of asymmetric laser bandwidth on a Bossung curve can be estimated using the procedure as described above.

Now the quadratic CD (CD=C+B·$F^2$) for an arbitrary focus position F becomes:

$$\overline{CD} = \frac{1}{2} \frac{\int_{F-a \cdot R_x}^{F} C + B \cdot f^2 \, df}{\int_{F-a \cdot R_x}^{F} df} + \frac{1}{2} \frac{\int_{F}^{F+2a \cdot R_x} C + B \cdot f^2 \, df}{\int_{F}^{F+2a \cdot R_x} df} =$$

$$\frac{\int_{F-a \cdot R_x}^{F+2a \cdot R_x} C + B \cdot f^2 \, df}{\int_{F-a \cdot R_x}^{F+2a \cdot R_x} df} = \frac{C \cdot f + B \cdot \frac{1}{3} f^3 \Big|_{F-a \cdot R_x}^{F+2a \cdot R_x}}{f \Big|_{F-a \cdot R_x}^{F+2a \cdot R_x}} =$$

$$\frac{C \cdot 3a \cdot R_x + B \cdot \frac{1}{3}((F + 2a \cdot R_x)^3 - (F - a \cdot R_x)^3)}{3a \cdot R_x} =$$

$$\frac{C \cdot 3a \cdot R_x + B \cdot \frac{1}{3}(3F^2 + 3a \cdot R_x + 3F \cdot 3a^2 \cdot R_x^2 + 9a^3 \cdot R_x^3)}{3a \cdot R_x} =$$

$$C + B \cdot \frac{1}{3}(3F^2 + 3F \cdot a \cdot R_x + 3a^2 \cdot R_x^2)$$

Rewriting this equation and generalizing it for all for Focus f results in:

$$CD = C + B \cdot F^2 + B \cdot F \cdot a \cdot R_x + B \cdot a^2 \cdot R_x^2$$

Now not only an offset is introduced (as is the case for a symmetric focus history) but also a linear term. This results in a tilt of the Bossung curve. This tilt could be used to compensate for Z9 errors (commonly resulting in a Bossung tilt). Also this tilting behavior could be used to influence side wall angles and pattern collapse behavior.

Figure 12:
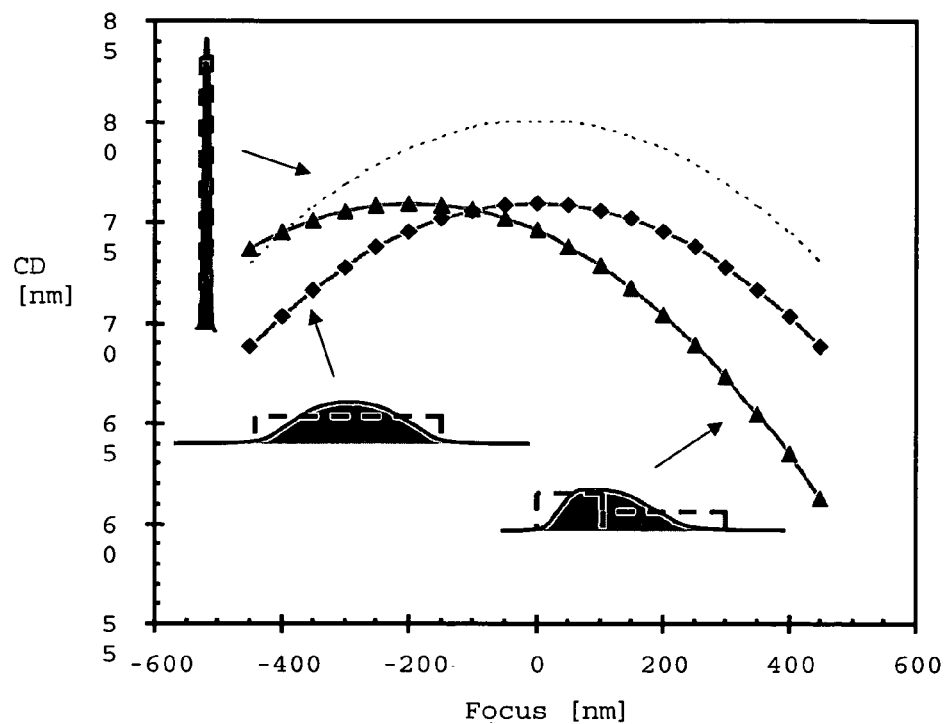
FIG. 12 is an example of a part of a Bossung curve showing schematically the effect of wafer Rx tilt or laser bandwidth.

Referring to FIG. 12, there is shown an example of a part of a Bossung curve (CD versus focus as function of energy (iso-energy line is depicted)) showing the impact of symmetrical and asymmetrical laser bandwidth increase as compared to normal exposure. Note for both the symmetrical and asymmetrical case the total focal range is the same.

Figure 13:
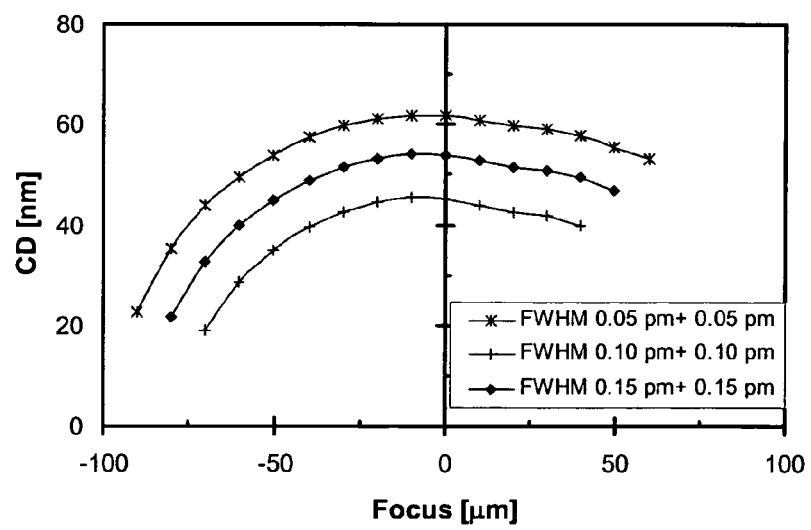
FIG. 13 is a simulated effect of symmetric increase of FWHM (Full Width Half Maximum) for nominal 65 nm isolated lines.

Turning now to FIG. 13 there is shown the simulated effect of symmetric increase of FWHM (Full Width Halve Maximum) for nominal 65 nm isolated lines (Prolith 5 pass calculation, NA 0.93 and sigma 0.94/0.74, binary reticle, calibrated resist model). As expected from the calculations, the constant decrease in CD through focus by introduction of an enlarged laser bandwidth. Note all calculation are performed using the same exposure dose.

Figure 14:
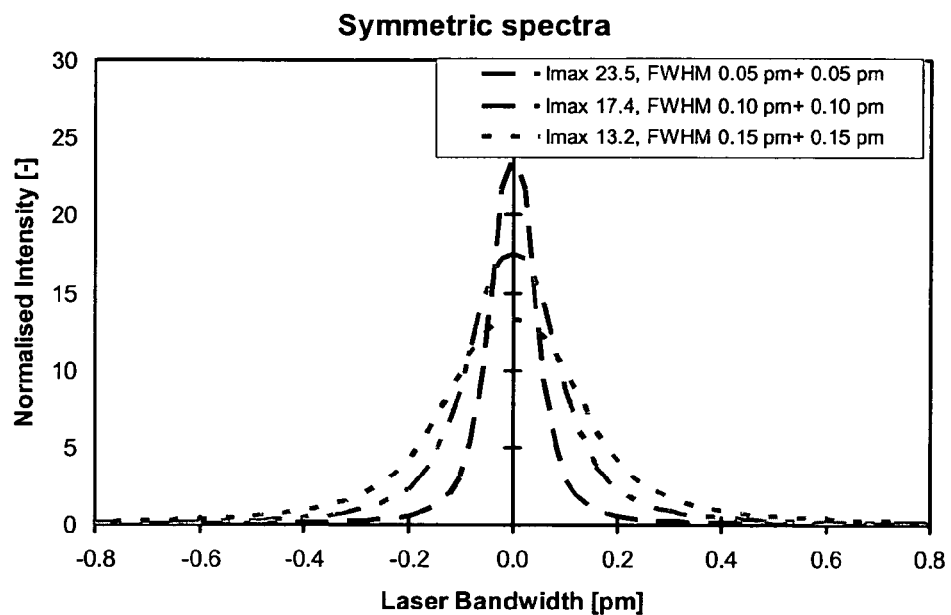
FIG. 14 is a symmetric laser bandwidth distribution as used for the simulations of FIG. 13.

Referring to FIG. 14 there is shown a symmetric laser bandwidth distribution as used for the simulations in FIG. 13. For the simulations these laser bandwidth distributions were approximated.

Figure 15:
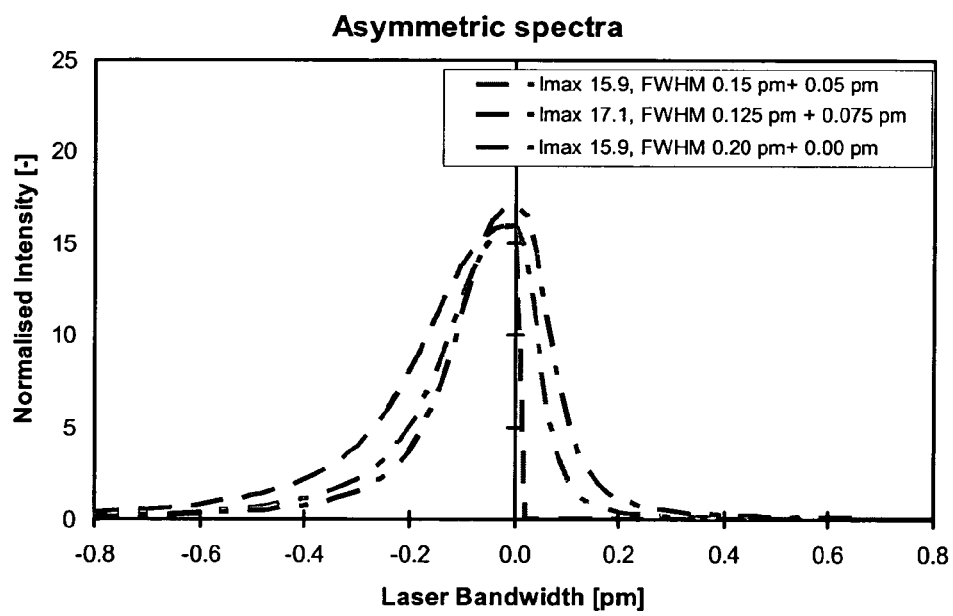
FIG. 15 is an asymmetric laser bandwidth distribution.

Referring next to FIG. 15, there is shown an asymmetric laser bandwidth distribution. For the simulations these laser bandwidth distributions were approximated.

Figure 16:
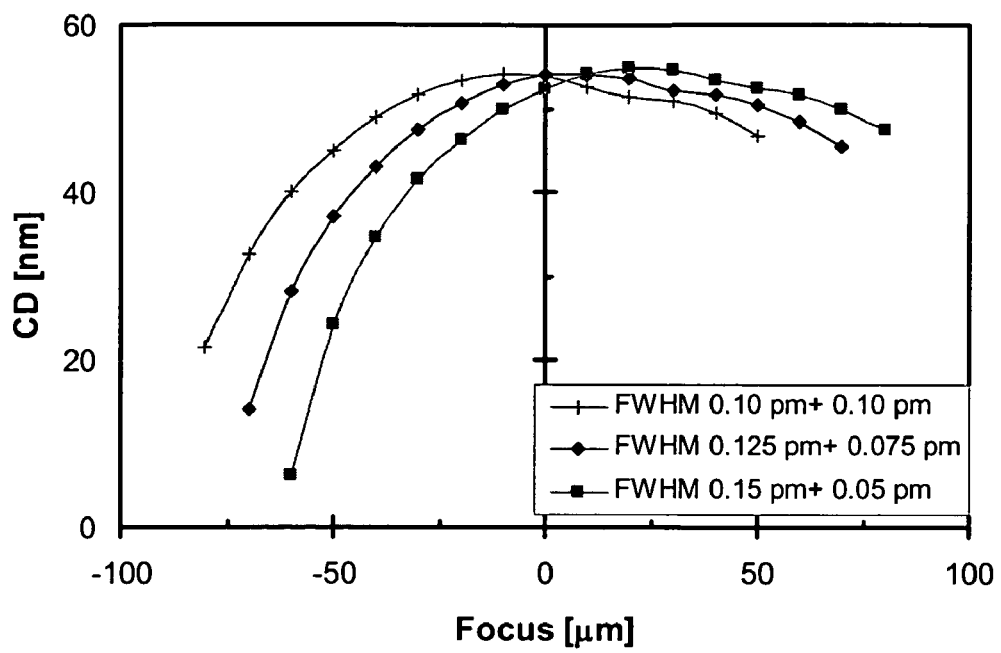
FIG. 16 is a simulated effect of increased laser bandwidth asymmetry for constant FWHM.

Referring now to FIG. 16, there is shown the simulated effect of increased laser bandwidth asymmetry for constant FWHM (Full Width Halve Maximum=0.2 pm) for nominal 65 nm isolated lines (Prolith 5 pass calculation, NA 0.93 and sigma 0.94/0.74, binary reticle, calibrated resist model). As expected from the calculations, a shift in of the Bossung curve in focus and change of the Bossung tilt. Note all calculation were performed using the same exposure dose.

Figure 17:
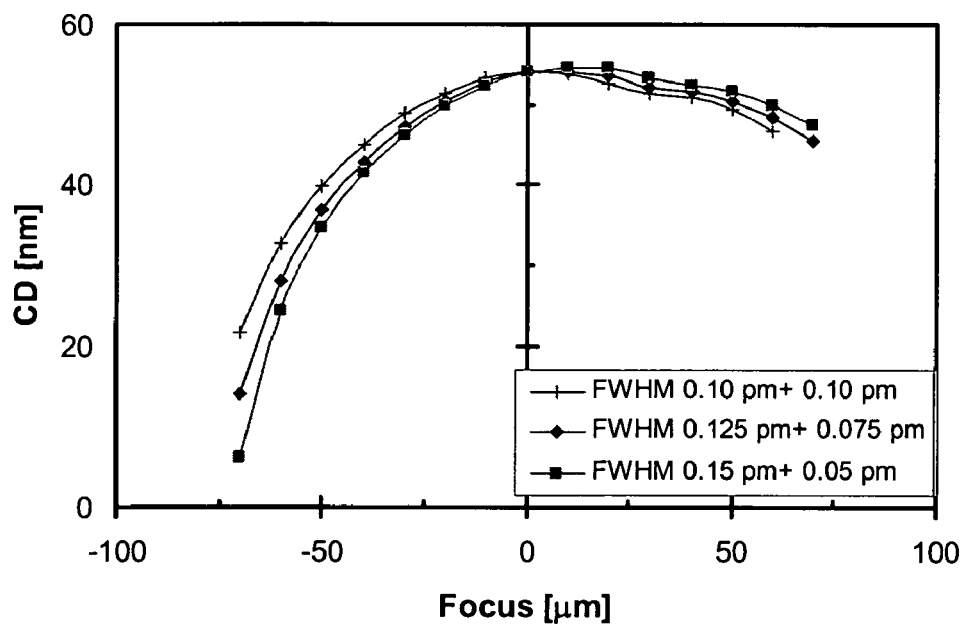
FIG. 17 is the same results as depicted for FIG. 17 after correcting for focus shift.

Referring finally to FIG. 17, there are shown the same results as depicted in FIG. 16 after correcting for the focus shift showing that, as expected from the calculations, the Bossung curve has tilted due to the introduction of an asymmetric laser bandwidth for constant FWHM (Full Width Halve Maximum=0.2 pm) for nominal 65 nm isolated lines (Prolith 5 pass calculation, NA 0.93 and sigma 0.94/0.74, binary reticle, calibrated resist model). Note all calculations were performed using the same exposure dose.

While specific embodiments of the invention have been described above, it will be appreciated that the invention may be practiced otherwise than as described. The description is not intended to limit the invention. It will also be appreciated that the disclosed embodiments may include any of the features herein claimed.

The invention claimed is:

1. A lithographic apparatus comprising:
    a support structure configured to support a patterning device, the patterning device serving to impart a beam of radiation with a pattern in its cross-section;
    a substrate table configured to hold a substrate;
    a projection system configured to project the patterned beam of radiation onto a target portion of the substrate; and
    a controller configured and arranged to change an energy spectrum of the beam of radiation such that the energy spectrum is asymmetric.

2. A lithographic apparatus as claimed in claim 1, wherein for a particular lithographic process to be performed on the lithographic apparatus, a process window is substantially symmetric with respect to focus.

3. A lithographic apparatus as claimed in claim 1, wherein the controller is configured and arranged to change the energy spectrum by superimposition of at least two wavelength spectra with a wavelength difference and a bandwidth difference.

4. A lithographic apparatus as claimed in claim 3, wherein the wavelength difference is selected from the group consisting of between 0 and 4 pm, and between 0 and 1 pm, and the bandwidth difference (E95) is selected from the group consisting of between 0 and 1.0 pm, and approximately 0.5 pm.

5. A lithographic apparatus as claimed in claim 3, wherein the at least two wavelength spectra further have different intensities.

6. A lithographic apparatus as claimed in claim 5, wherein the intensities differ by more than 10%.

7. A lithographic apparatus as claimed in claim 5, wherein $$1.1 \le \frac{|I_{left}|}{|I_{right}|} \text{ or } 0.9 \ge \frac{|I_{left}|}{|I_{right}|}.$$

where $I_{left}$ is an intensity of a first wavelength spectra, and $I_{right}$ is an intensity of a second wavelength spectra.

8. A lithographic apparatus as claimed in claim 1, further comprising:
    a beamsplitter constructed and arranged to split the beam into at least two components having different wavelengths;
    an optical component selected from the group consisting of a wavelength shifter constructed and arranged to shift an energy spectrum of at least one of the components, and an attenuator constructed and arranged to attenuate at least one of the components; and
    a beam recombinator constructed and arranged to recombine the components.

9. A lithographic apparatus as claimed in claim 1, comprising a plurality of radiation sources.

10. A lithographic apparatus as claimed in claim 9, wherein the radiation sources have discrete and separate output peaks.

11. A lithographic apparatus as claimed in claim 10, wherein the separation of the discrete peaks is selected from the group consisting of between 0 and 1.0 pm and between 0 and 0.5 pm.

12. A lithographic apparatus as claimed in claim 1, wherein the asymmetric energy spectrum comprises at least two wavelength spectra which are exposed upon the substrate substantially simultaneously.

13. A lithographic apparatus as claimed in claim 1, wherein the asymmetric energy spectrum comprises at least two wavelength spectra which are exposed upon the substrate sequentially.

* * * * *